(12) United States Patent
Bellin et al.

(10) Patent No.: US 9,084,370 B2
(45) Date of Patent: Jul. 14, 2015

(54) ELECTRONIC COMPUTER COMPRISING AN AIR CHANNELING SYSTEM FOR COOLING ELECTRONIC BOARDS

(71) Applicant: Thales, Neuilly sur Seine (FR)

(72) Inventors: Bruno Bellin, Meudon la Foret Cedex (FR); Francoise Brehin, Meudon la Foret Cedex (FR)

(73) Assignee: Thales (FR)

( * ) Notice: Subject to any disclaimer, the term of this patent is extended or adjusted under 35 U.S.C. 154(b) by 320 days.

(21) Appl. No.: 13/721,692

(22) Filed: Dec. 20, 2012

(65) Prior Publication Data
US 2013/0170132 A1  Jul. 4, 2013

(30) Foreign Application Priority Data

Jan. 4, 2012 (FR) ...................... 12 00026

(51) Int. Cl.
*H05K 7/20* (2006.01)
*G06F 1/20* (2006.01)

(52) U.S. Cl.
CPC .............. *H05K 7/20145* (2013.01); *G06F 1/20* (2013.01); *H05K 7/20563* (2013.01)

(58) Field of Classification Search
USPC ....................... 361/679.46–679.54, 688–723; 165/80.2; 174/547, 548; 312/236
See application file for complete search history.

(56) References Cited

U.S. PATENT DOCUMENTS

| | | | | |
|---|---|---|---|---|
| 4,399,485 A * | 8/1983 | Wright et al. | ................. | 361/693 |
| 4,498,118 A * | 2/1985 | Bell | ............... | 361/694 |
| 5,361,188 A * | 11/1994 | Kondou et al. | ............... | 361/695 |
| 5,477,416 A * | 12/1995 | Schkrohowsky et al. | ..... | 361/695 |
| 5,493,473 A * | 2/1996 | Yanagi | ........................ | 361/695 |
| 5,889,651 A * | 3/1999 | Sasaki et al. | ................... | 361/699 |
| 6,226,182 B1 * | 5/2001 | Maehara | ....................... | 361/695 |
| 6,625,033 B1 * | 9/2003 | Steinman | ...................... | 361/753 |
| 6,797,879 B2 * | 9/2004 | Leyda et al. | .................... | 174/50 |
| 7,256,992 B1 | 8/2007 | Stewart et al. | | |
| 2004/0190243 A1 * | 9/2004 | DiStefano | ..................... | 361/687 |
| 2009/0059516 A1 | 3/2009 | Lai et al. | | |
| 2012/0285665 A1 * | 11/2012 | Rebeyrotte et al. | ...... | 165/104.34 |

FOREIGN PATENT DOCUMENTS

WO  WO 2005/031549  4/2005

OTHER PUBLICATIONS

Search Report mailed on Jun. 26, 2012, issued in connection with French Patent Appln. No. 1200026 (3 pages).

\* cited by examiner

*Primary Examiner* — Zachary M Pape
(74) *Attorney, Agent, or Firm* — McCarter & English, LLP

(57) ABSTRACT

The electronic computer according to the invention comprises:
  a storage case comprising a housing including an air inlet and an air outlet for the circulation of a flow of cooling air through the housing,
  an electronic motherboard comprising a first surface and a second surface, the second surface being provided with connectors for receiving electronic daughterboards, and
  an air channeling system configured so as to channel the air hitting the first surface of the electronic motherboard to bring it to the side of the second surface of the electronic motherboard.
According to one aspect of the invention, the air channeling system is configured to spray the electronic daughterboards, so as to cool said electronic daughterboards through convection of the air.

8 Claims, 3 Drawing Sheets

ELECTRONIC COMPUTER COMPRISING AN AIR CHANNELING SYSTEM FOR COOLING ELECTRONIC BOARDS

RELATED APPLICATIONS

This application claims the benefit of French Patent Application No. 1200026 filed on Jan. 4, 2012. The entire disclosure of this application is incorporated herein by reference.

FIELD OF THE INVENTION

The present invention relates to an electronic computer comprising:
- a storage case comprising a housing including an air inlet and an air outlet for the circulation of a flow of cooling air through the housing,
- an electronic motherboard comprising a first surface and a second surface, the electronic motherboard being received in the housing such that the electronic motherboard defines a partition opposing the flow of air, the air entering the housing striking the first surface, the second surface being provided with connectors for receiving electronic daughterboards, and
- an air channeling system configured so as to channel the air hitting the first surface of the electronic motherboard to bring it to the side of the second surface of the electronic motherboard.

In particular, the invention applies to civil aircrafts equipped with onboard electronic computers, said computers being provided with electronic boards whereof the components must be cooled to ensure full output of the computer.

BACKGROUND OF THE INVENTION

To that end, it is possible to provide the electronic computer with thermal drains extending between the components of the electronic daughterboards and air circulation ducts. The air circulating in the ducts is therefore not in direct contact with the electronic daughterboards arranged on the electronic motherboard, but makes it possible to cool the components of the electronic daughterboards indirectly through heat exchange via the drains.

However, such an electronic computer only makes it possible to cool the components present in the electronic boards adapted to be inserted into the computer in a limited way, since the thermal power that can be dissipated through conduction is limited.

One of the aims of the invention is to propose an electronic computer making it possible to improve the cooling of the components present on electronic boards adapted to be inserted into the computer.

SUMMARY OF THE INVENTION

To that end, the invention relates to an electronic computer of the aforementioned type, wherein the air channeling system is configured to spray the electronic daughterboards received on the electronic motherboard with channeled air, so as to cool said electronic daughterboards through convection of the air.

According to other embodiments, the electronic computer comprises one or more of the following features, considered alone or according to all technically possible combinations:
- the air channeling system includes at least one air circulation duct comprising a plurality of calibrated openings, each opening being provided to form an air jet flowing along an electronic daughterboard received on a connector, the air jet flowing in a spraying direction that is inclined relative to the largest dimension of the electronic motherboard, preferably parallel to the largest dimension of the electronic motherboard;
- the electronic motherboard comprises at least one notch allowing the flow of air;
- the air channeling system is supplied from a notch;
- the air channeling system comprises a series of openings extending along a space for receiving an electronic daughterboard, the openings being configured to spray at least one surface of the electronic daughterboard with the channeled air, in a spray direction;
- the air channeling system is provided with at least one board guide adapted for guiding an electronic daughterboard toward the electronic motherboard when it is inserted into the housing of the storage case;
- the or each board guide is a longitudinal plate with a U-shaped section;
- the electronic computer comprises at least one daughterboard adapted to be inserted on a connector of the electronic motherboard, from the top toward the bottom in an insertion direction; and
- the electronic computer is in accordance with standard ARINC 600.

BRIEF DESCRIPTION OF THE DRAWINGS

The invention and its advantages will be better understood upon reading the following description, provided solely as an example, and done in reference to the appended drawings, in which.

DETAILED DESCRIPTION OF PREFERRED EMBODIMENTS

Figure 1:
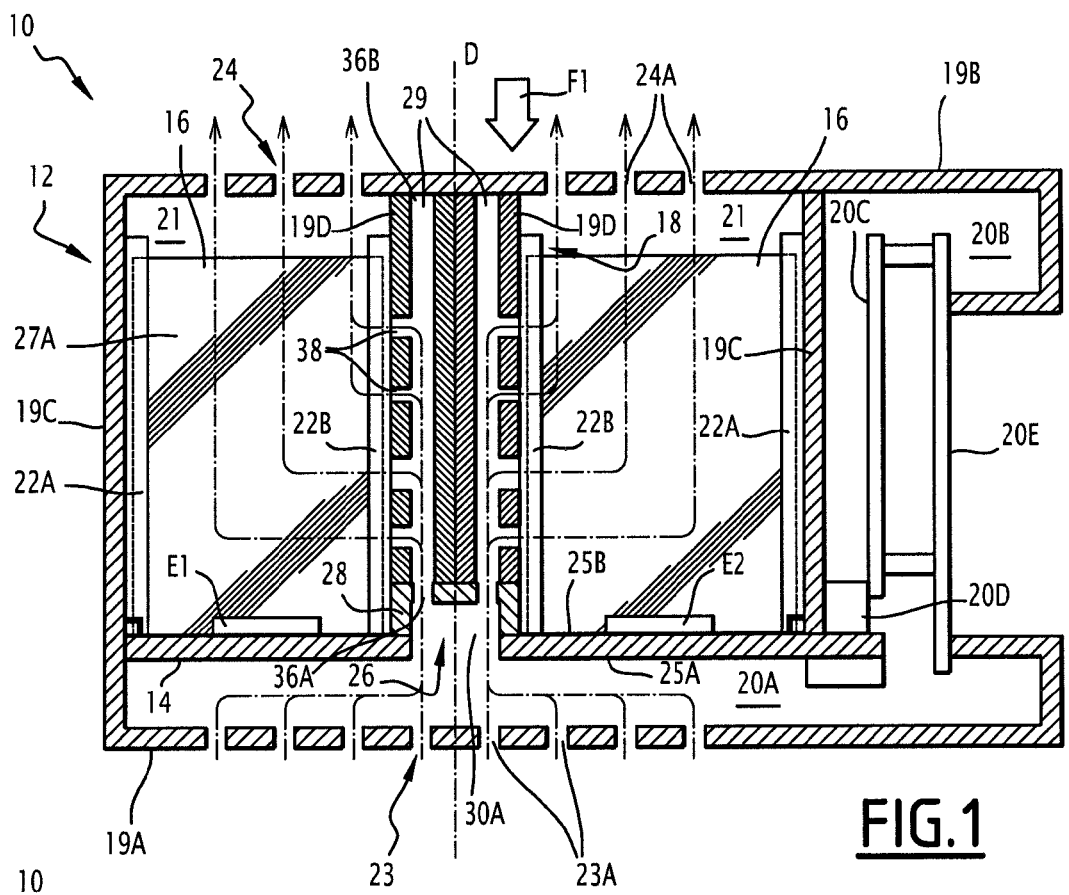
FIG. 1 is a cross-sectional side view of an electronic computer according to the invention including a storage box.
Figure 2:
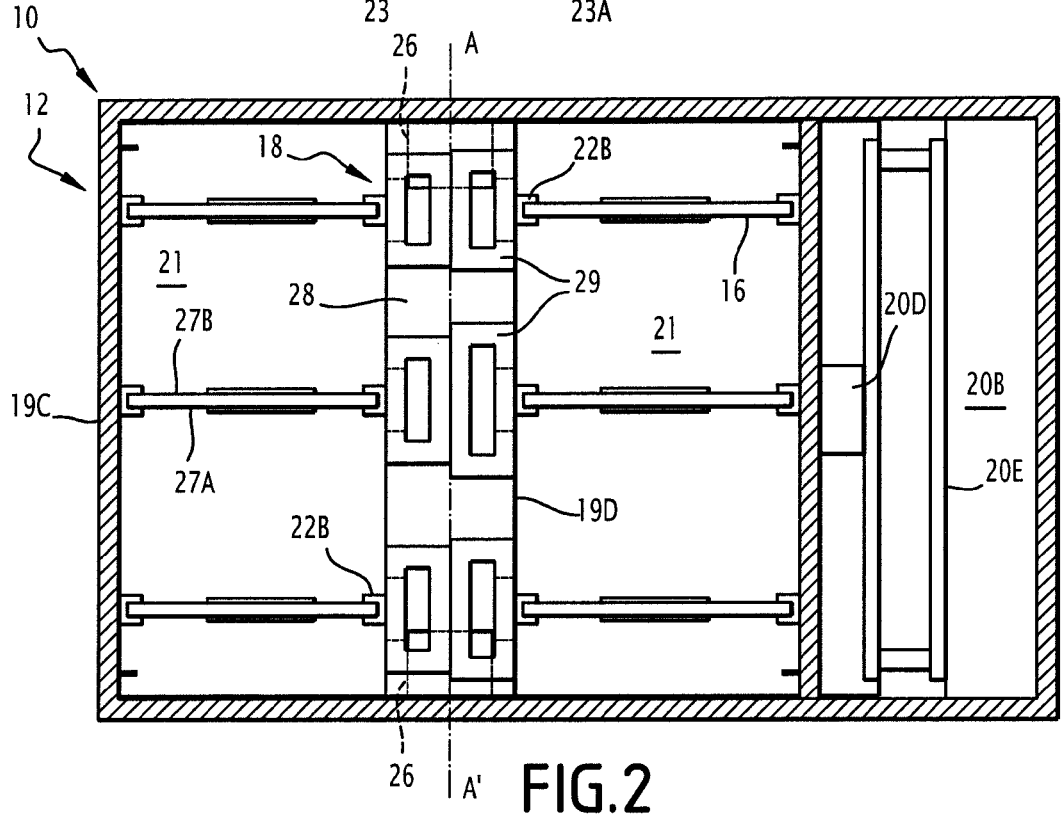
FIG. 2 is a top view of the electronic computer of FIG. 1, where the upper wall of the storage case has been omitted.

The electronic computer 10 illustrated in FIGS. 1 and 2 comprises a storage case 12 and an electronic motherboard 14 received inside the storage case 12, and hereafter called the motherboard 14. The computer 10 also includes electronic daughterboards 16 adapted to be removably inserted in the storage case 12, hereafter called daughterboards 16, and an air channeling system 18 permanently attached in the storage case 12.

The computer 10 may comprise a number N1 of electronic daughterboards, N1 being an integer greater than or equal to one.

The computer 10 is adapted to be stored onboard inside a civil aircraft. The computer 10 is for example an onboard electronic computer, according to aeronautics standard ARINC 600. According to this standard, a flow of pulsed air coming from the inside of the cabin of the aircraft is oriented over the bottom of the computer 10.

The storage case 12 includes a bottom wall 19A, an upper wall 19B, two side walls 19C and two central walls 19D delimiting a receiving housing 20A for the motherboard 14 and daughterboards 16. The storage case 12 also includes a cavity 20B designed to receive connector technology elements, for example such as a mothercard 20C connected to the motherboard 14 by a mothercard connector 20D and a connection card 20E provided to connect cable terminations.

The upper wall 19B is removable to allow the daughterboards 16 to be inserted into the storage case 12.

Each central wall 19D is situated across from a respective side wall 19C. Each central wall 19D defines, with the opposite side wall 19C, a space 21 for receiving daughterboards 16 within the housing 20A.

The storage case 12 comprises, in each space 21, pairs of longitudinal board guides, each pair comprising a longitudinal board guide 22A on a side wall 19C and a longitudinal board guide 22B on a central wall 19D.

Each board guide 22A, 22B is adapted to receive the side edge of a daughterboard 16 and guide it during its insertion in the receiving space 21, up to a connector E1, E2 of the motherboard 14. Each board guide 22A, 22B is also adapted to contribute to keeping a daughterboard 16 on its connector E1, E2. In the illustrated example embodiment, each board guide 22A, 22B respectively has a U-shaped section open toward the associated board guide 22A, 22B.

The housing 20A comprises an air inlet 23 and an air outlet 24. The air inlet 23 and the air outlet 24 are adapted to allow the circulation of a flow of cooling air through the housing 20A.

The air inlet 23 is situated on the bottom wall 19A, under the motherboard 14, and is designed so as to comply with the requirements imposed by standard ARINC 600, in particular in terms of pressure losses. The air inlet 23 includes several openings 23A allowing the air coming from below the computer 10 to enter the housing 20A.

The air outlet 24 is situated on the upper wall 19B. The air outlet 24 includes several openings 24A allowing the air coming from the inside of the housing 20A to exit.

The motherboard 14 includes a first surface 25A turned toward the bottom wall 19A and a second surface 25B opposite the first surface 25A and turned toward the upper wall 19B. The motherboard 14 also includes two openings. As illustrated in FIG. 2, each opening in this embodiment is a notch 26 formed in one of the peripheral edges of the motherboard 14, substantially at the center of that edge.

Each notch 26 for example has a square section, each side of the square having a length for example equal to 15 mm.

Alternatively, the motherboard 14 includes a number N2 of openings, N2 being an integer greater than or equal to one.

The motherboard 14 is received adjacent to the bottom wall 19A, in any case spaced away therefrom. It is fastened by screwing on a crown, said crown being secured to the side walls 19C. This assembly substantially sealably closes off the portion of the housing 20A situated between the air inlet 22 and the motherboard 14.

The motherboard 14 thus divides the housing 20A into an air inlet cavity and an air outlet cavity.

The second surface 25B comprises a respective connector E1, E2 for each daughterboard 16.

Each daughterboard 16 includes a first surface 27A and a second surface 27B opposite one another. Each daughterboard 16 also includes, on the second surface 27B thereof, means for keeping the daughterboard in contact with and fastening it on a board guide 22A, 22B. These means for maintaining contact and fastening are for example a guideway fastener, known in itself.

Each daughterboard 16 is adapted to be inserted into the receiving space 21 on its connector E1, E2 in a longitudinal insertion direction D.

In the rest of the description, the terms "top" and "bottom" are to be understood relative to the insertion of a daughterboard 16 into the storage case 12 in the longitudinal direction D, from the top toward the bottom along the arrow F1 in FIG. 1, and its removal in direction D, from the bottom toward the top.

The daughterboards 16 are for example 3U format electronic boards, this format being known in itself.

The air channeling system 18 includes a transverse collector 28 supplied from the notches 26, and longitudinal air circulation ducts 29 supplied from the collector 28 and emerging in the spaces 21 through openings formed in each central wall 19D.

The transverse connector 28 is elongated and extends transversely, perpendicular to the direction D over the second surface 25B. The transverse collector 28 includes two ends 30A, 30B each emerging across from a notch 26.

Each duct 29 is elongated and extends longitudinally between the two central walls 19D, from the bottom or the top from the collector 28. Each duct 29 extends parallel to the direction D. In the example embodiment, each duct 29 defines a U-shaped profile and is closed by one of the central walls 19D.

Each duct 29 includes two ends 36A, 36B, as well as calibrated openings 38 formed of the central wall 19D closing them.

The end 36A emerges inside the collector 28 to be supplied with air in the collector 28.

The end 36B is closed by the upper wall 19B.

The openings 38 have different diameters from one another, the diameter of each opening 38 being adapted to the flow of air necessary to cool the area of the daughterboards 16 across from it. In the example embodiment, the openings 38 of a duct 29 are arranged such that, when the daughterboard 16 closest to the duct 29 is completely inserted into the storage case 12, some of the openings 38 emerge over a surface 27A of said daughterboard 16, the rest of the openings 38 emerging on the other surface 27B of said daughterboard 16.

Alternatively, the openings 38 of a duct 29 are arranged such that, when the daughterboard 16 closest to the duct 29 is completely inserted into the storage case 12, all of the openings 38 emerge on the surface 27A of said daughterboard 16.

During operation, each daughterboard 16 is inserted into the storage case 12, from the top toward the bottom, on its respective connector E1, E2. During this insertion, each daughterboard 16 is guided by a board guide 22A and a board guide 22B. Once inserted, each daughterboard 16 is kept in contact with and fastened on the board guides 22A, 22B by engaging its fastener using guideways.

When the computer 10 is in use, in other words when the aircraft inside which it is onboard is in motion, the electronic components present on the daughterboards 16 must be cooled. To that end, and according to standard ARINC 600, a flow of pulsed air coming from inside the cabin of the aircraft penetrates the inside of the storage case 12, in the housing 20A, via the air inlet 22. The motherboard 14 defines a partial partition opposing the flow of the air. The air nevertheless crosses that partition via the two notches 26. The air then passes from the side corresponding to the surface 25A of the motherboard 14 to the side corresponding to the surface 25B. The air is channeled by the channeling system 18. The air is collected by the collector 28, then conveyed to the inside of the ducts 29, parallel to the direction D. The air then passes through the openings 38 and is oriented on the daughterboards 16, parallel to the second surface 25B of the motherboard 14, along the large surfaces 27A, 27B of the daughterboards 16. The electronic components present on daughterboard 16 are then sprayed by the circulating air, in a spraying direction substantially perpendicular to the insertion direction D. The circulation of the air causes dissipation of the heat within those components, that dissipation being due to the convection movement of the air. The heated air then flows via the air outlet 24, according to standard ARINC 600, and is thus discharged from the computer 10. The flow of circulating air is shown in dotted lines in FIGS. 1 and 3.

Advantageously, forming the notches 26 in the peripheral edges of the motherboard 14 makes it possible to preserve the space available for the conductor tracks of the board and, as a result, not to alter the transmission of the electrical signals.

Advantageously, and as is the case in the illustrated embodiment, the daughterboards 16 are arranged longitudinally in the computer 10 according to the invention, i.e. their free edge with the largest dimension is parallel to the insertion direction D. This arrangement of the daughterboards 16 makes it possible to place a number N3 of boards 16 in the direction of the width of the computer 10 such that, the width being considered to be the dimension of the computer 10 parallel to the axis A-A' shown in FIG. 2, the number N3 is not limited by a maximum value. In fact, in standard ARINC 600, the width of the computer is the only non-restricted dimension.

One can thus see that such a computer 10 makes it possible to improve the effectiveness of the cooling of the electronic components present on the daughterboards 16 significantly.

Figure 3:
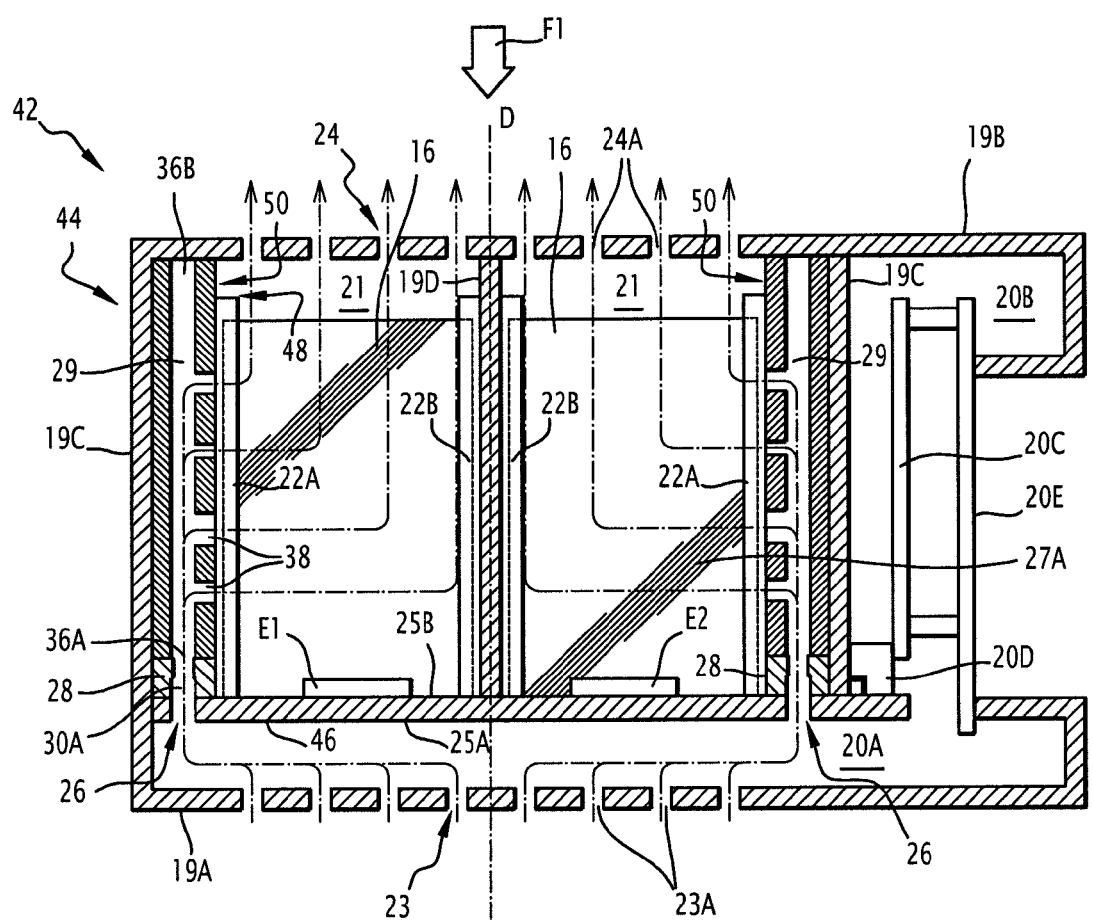
FIG. 3 is a cross-sectional side view of an electronic computer according to a second embodiment of the invention.

FIG. 3 illustrates a second embodiment of the invention, for which the elements similar to the first embodiment previously described are identified using identical references, and are therefore not described again.

An electronic computer 42 according to the invention comprises a storage box 44 and a motherboard 46 received inside the storage box 44. The computer 42 also includes daughterboards 16 that are adapted to be removably inserted into the storage case 44, and an air channeling system 48 permanently fastened in the storage box 12.

Unlike the storage box 12 according to the first embodiment, the storage box 44 only includes a single central wall 19D.

The system 48 for channeling air is formed in the side walls 19C. It comprises an air channeling assembly 50 in each side wall 19C.

The motherboard 46 includes four notches 26, each notch 26 being formed in the peripheral edge of the motherboard 46 at a corner of the motherboard.

Alternatively, the motherboard 46 includes a number N4 of notches 26, N4 being an integer greater than or equal to two.

Each air channeling assembly 50 includes a transverse collector 28 along one side of the motherboard 46.

Each air channeling assembly 50 includes an air circulation duct 29, extending along a board guide 22A for mounting a daughterboard 16 to supply the corresponding openings 38 with air.

The operation of this second embodiment is similar to that of the first embodiment previously described, and is therefore not described again.

Similarly to the storage box 12 according to the first embodiment of the invention, the storage box 44 is for example adapted to receive electronic daughterboards of format 3U.

Figure 4:
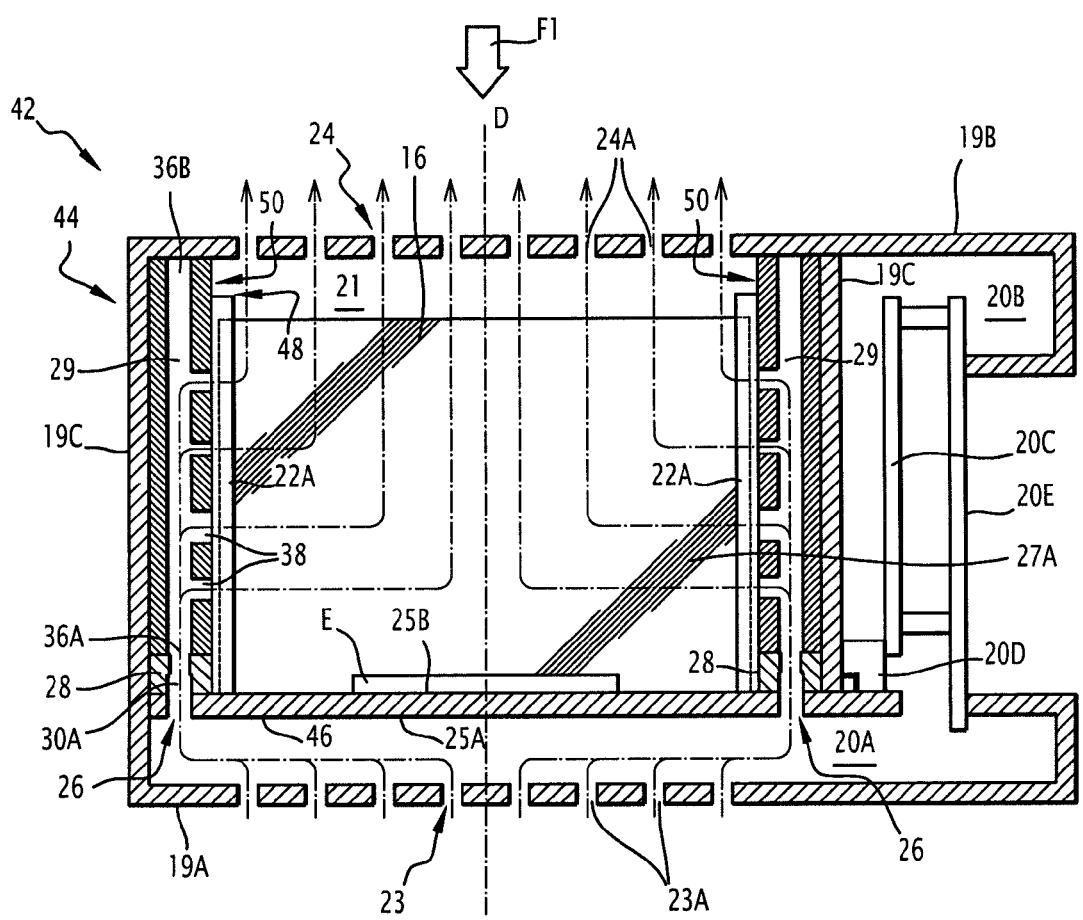
FIG. 4 is a view similar to that of FIG. 3 according to one alternative embodiment of the electronic computer of FIG. 3.

As an alternative embodiment and as illustrated in FIG. 4, the storage box 44 may advantageously receive electronic daughterboards of format 6U, that format being known in itself.

According to this alternative, the storage box 44 no longer includes a central wall 19D, and the two connectors E1, E2 of the motherboard 46 are replaced by a single connector E.

Furthermore, if the length of the computer is used as the dimension of the computer perpendicular to the axis A-A' shown in FIG. 2 and the direction D shown in FIG. 3, at most a single daughterboard of format 6U is adapted to be inserted in the direction of the length according to this alternative, instead of two daughterboards of format 3U.

This alternative of the second embodiment of the invention thus has the advantage of reducing the mass of the computer relative to the first embodiment previously described. The other advantages of this embodiment are identical to those of the first embodiment, and are therefore not described again.

The invention generally relates to an electronic computer comprising a storage case, a motherboard and an air channeling system. It of course also relates to electronic computers comprising a storage case, a motherboard, an air channeling system and daughterboards.

The invention applies to many fields, and in particular the transportation field, including the field of civil aviation, irrespective of whether the electronic computer is onboard.

The invention claimed is:

1. An electronic computer comprising:
    a storage case comprising a housing including an air inlet and an air outlet for the circulation of a flow of cooling air through the housing,
    an electronic motherboard comprising a first surface and a second surface, the electronic motherboard being received in the housing such that the electronic motherboard defines a partition opposing the flow of air, the air entering the housing striking the first surface, the second surface being provided with connectors for receiving electronic daughterboards, and
    an air channeling system configured so as to channel the air hitting the first surface of the electronic motherboard to bring it to the side of the second surface of the electronic motherboard,
    wherein the air channeling system is configured to spray the electronic daughterboards received on the electronic motherboard with channeled air, so as to cool said electronic daughterboards through convection of the air.

2. The electronic computer according to claim 1, wherein the air channeling system includes at least one air circulation duct comprising a plurality of calibrated openings, each opening being provided to form an air jet flowing along an electronic daughterboard received on a connector, the air jet flowing in a spraying direction that is inclined relative to the largest dimension of the electronic motherboard, preferably parallel to the largest dimension of the electronic motherboard.

3. The electronic computer according to claim 1, wherein the electronic motherboard comprises at least one notch allowing the flow of air.

4. The electronic computer according to claim 3, wherein the air channeling system is supplied from the at least one notch.

5. The electronic computer according to claim 1, wherein the air channeling system comprises a series of openings extending along a space for receiving an electronic daughterboard, the openings being configured to spray at least one surface of the electronic daughterboard with the channeled air, in a spray direction.

6. The electronic computer according to claim 1, wherein the air channeling system is provided with at least one board guide adapted for guiding an electronic daughterboard toward the electronic motherboard when it is inserted into the housing of the storage case.

7. The electronic computer according to claim 6, wherein the or each board guide is a longitudinal plate with a U-shaped section.

8. The electronic computer according to claim 1, wherein the electronic computer comprises at least one daughterboard adapted to be inserted on a connector of the electronic motherboard, from the top toward the bottom in an insertion direction.

\* \* \* \* \*